Sept. 23, 1969 J. J. GAMESON 3,469,201

TRANSISTOR AMPLIFIER

Filed March 5, 1968

INVENTOR

JOHN JEFFREYS GAMESON

BY Wane and Bailey

ATTORNEYS 3,469,201

TRANSISTOR AMPLIFIER

John Jeffreys Gameson, Toronto, Ontario, Canada, assignor to Telefonaktiebolaget L M Ericsson, Stockholm, Sweden, a corporation of Sweden Filed Mar. 5, 1968, Ser. No. 710,567
Claims priority, application Sweden, Mar. 15, 1967, 3,629/67
Int. Cl. H03f 3/26
U.S. Cl. 330—15 1 Claim

ABSTRACT OF THE DISCLOSURE

The present invention concerns a transistor amplifier comprising two push-pull connected transistors the emitter electrodes of which are connected to the opposite ends of the secondary winding of an input transformer and the collector electrodes of which are connected to the opposite ends of the primary winding of an output transformer which primary winding is provided with a centre tapping. When the amplifier is in an idle or standby condition means are provided for blocking disturbing signals received from the amplifier output.

In amplifiers of said type it is important to obtain a rapid connection and disconnection and to attain an effective blocking against disturbing signals received in backward direction from the output transformer. Upon disconnection by for example breaking the base potential, a relatively long time is necessary to achieve complete attenuation and also upon complete attenuation an inadequate blocking is obtained against disturbing signals in backward direction since the emitter-collector circuit in a certain degree is conducting for the applied disturbing signal.

The purpose of this invention is to provide a transistor amplifier of the above mentioned type which can be brought more rapidly from idle condition to working condition and vice versa than the usual transistor amplifiers and which furthermore in disconnected condition effectively blocks disturbing signals in backward direction independently of their amplitude.

The transistor amplifier according to the invention is characterized thereby that the collector lead-in of each of the transistors contains a diode and the centre point of the output transformer in working condition of the amplifier is connected to a first potential that allows a direct current to pass through said diodes, while, in order to block the amplifier, said centre point is connectable through a further diode and an impedance to a second potential that forms a blocking voltage, so that the collector circuits are kept blocked by this blocking voltage against disturbing signals incoming through the output transformer as long as their amplitude does not compensate the blocking voltage and furthermore through a capacitor to said first-mentioned potential, so that when the disturbing voltage exceeds said blocking voltage and consequently one of the diodes in the collector lead-in conductors becomes conducting, the voltage of said capacitor will be increased by the difference value between the disturbing voltage exceeds said blocking voltage and tains the diodes in the collector lead-in conductors blocked against such disturbing voltages, the amplitude of which does not exceed the last received disturbing signal.

Figure 1:
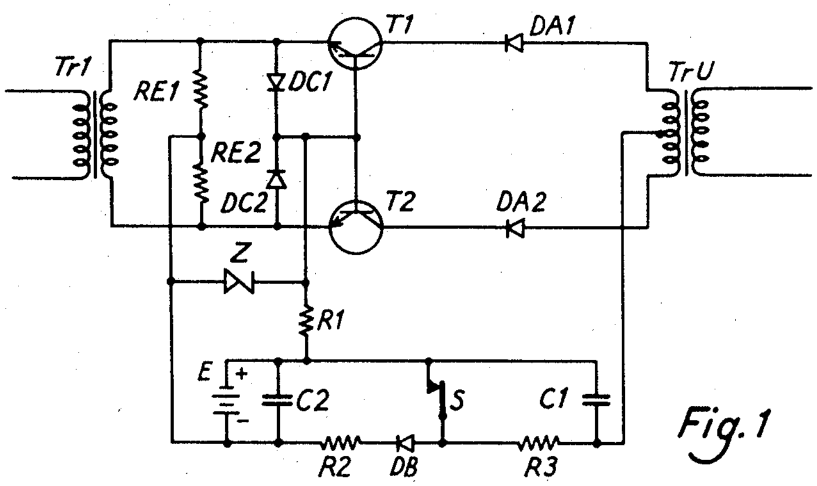
Figure 2:
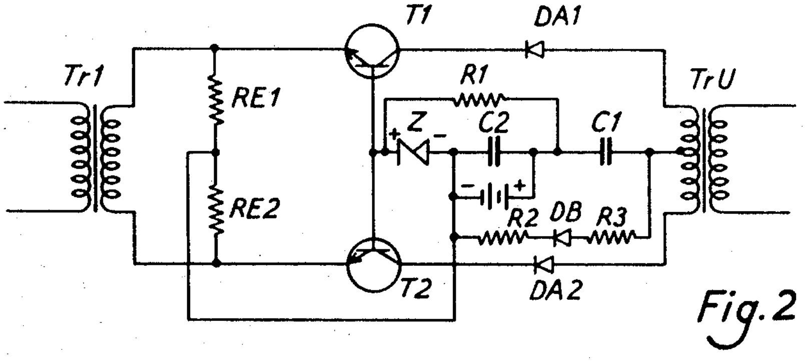
Figure 3:
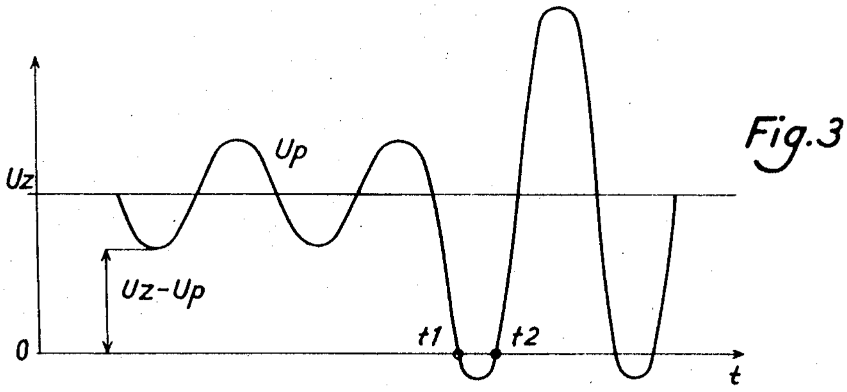

The invention will be explained more in detail here below by means of an embodiment with reference to the enclosed drawing on which FIG. 1 shows a circuit diagram of the amplifier according to the invention, FIG. 2 shows the same diagram for blocked condition with a certain rearrangement of the location of the components in the circuit diagram in order to elucidate the principle and FIG. 3 shows the time process of the disturbing signal in relation to the blocking voltage.

According to the circuit diagram in FIG. 1 the amplifier comprises two push-pull connected transistors T1 and T2 which according to the example are of the NPN-type. Their emitter electrodes are connected to the opposite ends of a secondary winding of an input transformer TrI and their collector electrodes are each through a diode DA1 and DA2 respectively connected to the opposite ends of a primary winding of an output transformer TrU. The bases of the transistors are maintained at a constant, according to the example positive potential from one of the terminals of a Zener-diode Z which in series with a resistance R1 is connected across a voltage source E. The negative pole of the voltage source is connected to the connecting point between two resistances RE1 and RE2 which are connected in series between the emitter electrodes. The base electrodes are connected to the cathodes of two diodes DC1 and DC2, the anode side of one of which is connected to the emitter electrode of the transistor T1 and of the other to the emitter electrode of the transistor T2 and the purpose of which diodes is to protect the base emitter diodes of the transistors against too high reverse voltages in the known manner. The centre point of the output transformer TrU is in series with a resistance R3, a diode DB and a resistance R2 connected to the negative pole of the voltage source. The positive pole of the voltage source E is connected through a make contact S to the anode side of the diode DB and furthermore through a capacitor C1 to the centre point of the transformer TrU. The voltage source is also shunted by a capacitor C2.

In normal function the contact S is closed and the centre point of the output transformer is in contact with the positive pole of the voltage source through the resistance R3, so that a direct current passes through the collector circuits and an alternating voltage signal applied to the base emitter circuit is amplified in the conventional manner. When the amplifier has to be blocked, the contact S is opened. The condition now arising can be represented by the circuit diagram of FIG. 2 which is an exact correspondence to FIG. 1, with the difference that the components which in this condition co-operate with each other in order to achieve the desired effect, are placed close to each other for the sake of lucidity. As it appears the centre point of the output transformer is now connected to the negative pole of the voltage source through the resistance R3, the diode DB and the resistance R2 and furthermore to the positive pole of the voltage source through the capacitor C1. Thus the collector circuits become blocked both against signals in forward direction and against signals in backward direction. The centre point of the output transformer and consequently the anode of the diodes DA1 and DA2 are namely maintained at negative potential owing to the fact that the diode DB is conducting. This is easy to understand when considering that in the circuit formed from the positive pole of the Zener-diode through the base-collector diode of for example the transistor T1, through the diode DA1 in backward direction, one of the winding halves of the transformer TrU, the resistance R3, the diode DB and the resistance R2 to the negative pole of the Zener-diode, a weak current will arise, the voltage drop from the centre point of the transformer to the negative pole of the voltage source being negligible.

The curve of FIG. 3 shows a disturbing signal in a very diagrammatic form. The link part of the curve represents the position of low disturbing voltages. The blocking voltage of the diode DA which is approximately equal to the voltage $U_z$ of the Zener-diode is decreased by a disturbing voltage $U_p$ induced in the primary winding of the output transformer. Thus a disturbing voltage that is lower than the voltage through the Zener-diode $U_z$ will not nullify the blocking voltage in consequence of which the amplifier will be protected evidently against disturbing signals in backward direction as long as their level does not reach the level of the blocking voltage (see FIG. 3). If now the disturbing voltage increases and exceeds $U_z$, for example the diode DA1 will obtain voltage in forward direction and the diode DB voltage in backward direction during the interval $t1$–$t2$. During this time the circuit passing through the collector emitter circuit of the transistor T1 and the resistance RE1 will function as an ordinary half-wave rectifier, causing the capacitor C1 to be charged by a further voltage $U_c$ in correspondence to the value by which the disturbing signal has exceeded the blocking voltage $U_z$. The voltage $U_c$ is added to the blocking voltage $U_z$ and after the time $t2$ the diode DA1 has a reverse voltage $U_z+U_c$ and the diode DB a reverse voltage $U_c$. The reverse impedance of the diodes DA and DB is so high that the discharge of the capacitor C1 between the chargings is negligible. The consequence of this is that the blocking capacity of the amplifier in the backward direction is adapted automatically to the existing disturbing voltage level.

The invention is of course not limited to the use of transistors of the NPN-type but can as well be applied to transistors of the PNP-type.

It has been found that the amplifier according to the invention is superior to the conventional transistor amplifiers of push-pull type both in connection and disconnection and in view of attenuation in backward direction against disturbing signals.

I claim:

1. Transistor amplifier comprising two push-pull connected transistors the emitter electrodes of which are connected to the opposite ends of the secondary winding of an input transformer and the collector electrodes of which are connected to the opposite ends of the primary winding of an output transformer which primary winding is provided with a centre tapping, characterized thereby that the collector lead-in conductor of each transistor contains a diode and the centre point of the output transformer in working condition of the amplifier is connected to a first potential that allows a direct current to pass through said diodes, while, in order to block the amplifier, said centre point is connectable through a further diode and an impedance to a second potential which forms a blocking voltage, so that the collector circuits are kept blocked by this blocking voltage against disturbing signals incoming through the output transformer as long as their amplitude does not compensate the blocking voltage and furthermore through a capacitor to said first-mentioned potential, so that when the disturbing signal exceeds this blocking voltage and consequently one of the diodes in the collector lead-in conductors becomes conducting, the voltage of said capacitor will be increased by the difference value between the disturbing signal and said blocking voltage and maintains the diodes in the collector lead-in conductors blocked against such disturbing voltages, the amplitude of which does not exceed the last received disturbing signal.

References Cited

UNITED STATES PATENTS 3,015,780 1/1962 Schayes et al. ------ 330—15 X

ROY LAKE, Primary Examiner

J. B. MULLINS, Assistant Examiner

U.S. Cl. X.R.

330—40, 123